US010309981B2

(12) United States Patent
Wakasugi et al.

(10) Patent No.: US 10,309,981 B2
(45) Date of Patent: Jun. 4, 2019

(54) TARGET SPEED DETERMINATION DEVICE, TARGET SPEED DETERMINATION METHOD AND PROGRAM, VEHICLE CONTROL DEVICE, AND VEHICLE

(71) Applicant: Mitsubishi Heavy Industries Engineering, Ltd., Yokohama-shi, Kanagawa (JP)

(72) Inventors: Kazuyuki Wakasugi, Tokyo (JP); Toshihiko Niinomi, Tokyo (JP)

(73) Assignee: MITSUBISHI HEAVY INDUSTRIES ENGINEERING, LTD., Kanagawa (JP)

( * ) Notice: Subject to any disclaimer, the term of this patent is extended or adjusted under 35 U.S.C. 154(b) by 484 days.

(21) Appl. No.: 14/653,257

(22) PCT Filed: Sep. 20, 2013

(86) PCT No.: PCT/JP2013/075492
§ 371 (c)(1),
(2) Date: Jun. 17, 2015

(87) PCT Pub. No.: WO2014/125670
PCT Pub. Date: Aug. 21, 2014

(65) Prior Publication Data
US 2015/0316573 A1    Nov. 5, 2015

(30) Foreign Application Priority Data

Feb. 15, 2013   (JP) .................................. 2013-028355

(51) Int. Cl.
*G01P 5/00*    (2006.01)
*G01P 7/00*    (2006.01)
(Continued)

(52) U.S. Cl.
CPC ................ *G01P 3/42* (2013.01); *B60L 1/003* (2013.01); *B60L 7/14* (2013.01); *B60L 9/22* (2013.01);
(Continued)

(58) Field of Classification Search
CPC .... G01P 3/42; G01P 3/56; B60L 1/003; B60L 7/14; B60L 9/22; B60L 11/1861; B60L 15/2009; B60W 40/105; B60R 21/00
See application file for complete search history.

(56) References Cited

U.S. PATENT DOCUMENTS

2002/0105225 A1\*  8/2002  Endo ........................ B60K 6/48
                                                       303/152
2005/0059529 A1\*  3/2005  Sakamoto ............. B60W 10/06
                                                       477/174
(Continued)

FOREIGN PATENT DOCUMENTS

JP        62-135207 A      6/1987
JP        4-287766 A       10/1992
(Continued)

OTHER PUBLICATIONS

International Search Report dated Dec. 24, 2013, corresponding to International application No. PCT/JP2013/075492.
(Continued)

*Primary Examiner* — Toan K Le
(74) *Attorney, Agent, or Firm* — Kanesaka Berner and Partners, LLP

(57) ABSTRACT

In the present invention: a power consumption calculation unit sets target speeds in a plurality of sections of a track; the power consumption calculation unit calculates, on the basis of the target speeds, the power consumption when the track is traveled; a target speed change unit changes combinations of target speeds in the plurality of sections set by the power
(Continued)

consumption calculation unit; an evaluation value calculation unit calculates an evaluation value on the basis of an evaluation function for each combination of target speeds; the evaluation function is a function in which the power consumption calculated by the power consumption calculation unit is multiplied by a prescribed weight; and a target speed determination unit sets the combination of target speeds in which the evaluation value is smallest as the target speed of the vehicle in each section.

7 Claims, 10 Drawing Sheets

(51) Int. Cl.
    *G01P 11/00*     (2006.01)
    *G01P 3/42*     (2006.01)
    *G01R 21/00*     (2006.01)
    *B60W 40/105*     (2012.01)
    *B60L 1/00*     (2006.01)
    *B60L 7/14*     (2006.01)
    *B60L 9/22*     (2006.01)
    *B60L 11/18*     (2006.01)
    *B60L 15/20*     (2006.01)
    *G01P 3/56*     (2006.01)

(52) U.S. Cl.
    CPC ....... *B60L 11/1861* (2013.01); *B60L 15/2009* (2013.01); *B60W 40/105* (2013.01); *G01P 3/56* (2013.01); *G01R 21/00* (2013.01); *B60L 2200/26* (2013.01); *B60L 2240/12* (2013.01); *B60L 2260/24* (2013.01); *B60L 2260/26* (2013.01); *Y02T 10/645* (2013.01); *Y02T 10/7005* (2013.01); *Y02T 10/705* (2013.01); *Y02T 10/7044* (2013.01); *Y02T 10/72* (2013.01); *Y02T 10/7275* (2013.01)

(56) References Cited

U.S. PATENT DOCUMENTS

| 2008/0059037 A1* | 3/2008 | Isaji ................... B60W 40/072 701/93 |
| 2014/0222259 A1* | 8/2014 | Yoshimoto .......... B61L 27/0027 701/20 |
| 2015/0151638 A1* | 6/2015 | Tagawa .............. G01C 21/3469 701/22 |

FOREIGN PATENT DOCUMENTS

| JP | 5-193502 A | 8/1993 |
| JP | 6-219282 A | 8/1994 |
| JP | 7-132829 A | 5/1995 |
| JP | 2004-155314 A | 6/2004 |

OTHER PUBLICATIONS

Written Opinion dated Dec. 24, 2013, corresponding to International application No. PCT/JP2013/075492.
Office Action in JP Application No. 2013-028355, dated Aug. 30, 2016.

* cited by examiner

TARGET SPEED DETERMINATION DEVICE, TARGET SPEED DETERMINATION METHOD AND PROGRAM, VEHICLE CONTROL DEVICE, AND VEHICLE

RELATED APPLICATIONS

The present application is a National Phase of International Application Number PCT/JP2013/075492, filed Sep. 20, 2013, which claims priority to Japanese Application Number 2013-028355, filed Feb. 15, 2013.

TECHNICAL FIELD

The present invention relates to a target speed determination device, a target speed determination method, and a program that determine target speed of a vehicle that performs acceleration or deceleration based on a difference between current speed and the target speed, a vehicle control device that performs control based on the target speed determined by the target speed determination device, and the vehicle.

Priority is claimed on Japanese Patent Application No. 2013-028355, filed Feb. 15, 2013, the content of which is incorporated herein by reference.

BACKGROUND ART

In recent years, demand for energy saving of a traffic system is increasing. PTL 1 discloses a speed pattern generation scheme for minimizing power consumption while satisfying various constraints. The speed pattern refers to information in which ON/OFF of a brake and ON/OFF of power running are associated with time.

CITATION LIST

Patent Literature

[PTL 1] Japanese Unexamined Patent Application Publication No. 5-193502

SUMMARY OF INVENTION

Technical Problem

Acceleration characteristics of a vehicle vary according to the number of passengers of the vehicle or weather. Therefore, when the vehicle travels at a speed pattern determined using the technology disclosed in PTL 1, the vehicle does not necessarily travel in the same time in each predetermined section.

An object of the present invention is to provide a target speed determination device, a target speed determination method, a program, a vehicle control device capable of causing a vehicle to travel over the same time in each section and reducing power consumption, and the vehicle.

Solution to Problem

A first aspect of the present invention is a target speed determination device that determines target speed of a vehicle that performs acceleration or deceleration based on a difference between current speed and the target speed. The target speed determination device includes a power consumption calculation unit, a target speed change unit, an evaluation value calculation unit, and a target speed determination unit. The power consumption calculation unit sets the target speed in a plurality of sections of a track. The power consumption calculation unit calculates power consumption when the vehicle has traveled on the track, based on the target speed. The target speed change unit changes a combination of the target speeds in the plurality of sections set in the power consumption calculation unit. The evaluation value calculation unit calculates an evaluation value based on an evaluation function for each combination of the target speeds. The evaluation function is a function of multiplying the power consumption calculated by the power consumption calculation unit by a predetermined weight. The target speed determination unit determines a combination of the target speeds for which the evaluation value is minimized to be a target speed in each section of the vehicle.

Further, a second aspect of the present invention is the target speed determination device of the first aspect including a sensitivity calculation unit. The sensitivity calculation unit calculates sensitivity indicating a size of an amount of a change in the evaluation value with respect to an amount of a change in the target speed for the plurality of sections. The evaluation value is the evaluation value calculated by the evaluation value calculation unit. The target speed change unit increases or decreases each target speed of each section used for previous calculation of the power consumption by the power consumption calculation unit according to a level of the sensitivity of the section calculated by the sensitivity calculation unit.

Further, a third aspect of the present invention is the target speed determination device of the first aspect or the second aspect including a penalty value calculation unit. The penalty value calculation unit calculates a penalty value. The penalty value indicates a degree of divergence from conditions to be satisfied by the vehicle in traveling on the track. The evaluation function is a function of taking a total sum of a value obtained by multiplying the power consumption by a predetermined weight and a value obtained by multiplying the penalty value by a weight greater than the weight of the power consumption.

Further, a fourth aspect of the present invention is the target speed determination device of any one of the first to third aspects including a power consumption calculation unit, an evaluation value calculation unit, a target charge rate change unit, and a target charge rate determination unit. The vehicle includes a secondary battery. The vehicle controls charge and discharge of the secondary battery based on a difference between a current charge rate and a target charge rate of the secondary battery. The power consumption calculation unit sets the target speed and the target charge rate in the plurality of sections. The power consumption calculation unit calculates power consumption when the vehicle has traveled on the track, based on the target speed and the target charge rate. The evaluation value calculation unit calculates the evaluation value for each combination of the target speed and the target charge rate. The target charge rate change unit changes a combination of the target charge rates in the plurality of sections set in the power consumption calculation unit. The target charge rate determination unit determines a combination of the target charge rates for which the evaluation value is minimized to be the target charge rate in each section of the vehicle.

Further, a fifth aspect of the present invention is a target speed determination method using a target speed determination device that determines target speed of a vehicle that performs acceleration or deceleration based on a difference between current speed and the target speed. A power consumption calculation unit sets the target speed in a plurality of sections of a track. The power consumption calculation unit calculates power consumption when the vehicle has traveled on the track, based on the target speed. A target speed change unit changes a combination of the target speeds in the plurality of sections set in the power consumption calculation unit. An evaluation value calculation unit calculates an evaluation value based on an evaluation function for each combination of the target speeds. The evaluation function is a function of multiplying the power consumption calculated by the power consumption calculation unit by a predetermined weight. A target speed determination unit determines a combination of the target speeds for which the evaluation value is minimized to be a target speed in each section of the vehicle.

Further, a sixth aspect of the present invention is a program for causing a computer to function as a power consumption calculation unit, a target speed change unit, an evaluation value calculation unit, and a target speed determination unit. The computer is a computer of a target speed determination device that determines target speed of a vehicle that performs acceleration or deceleration based on a difference between current speed and the target speed. The power consumption calculation unit sets the target speed in a plurality of sections of a track. The power consumption calculation unit calculates power consumption when the vehicle has traveled on the track, based on the target speed. The target speed change unit changes a combination of the target speeds in the plurality of sections set in the power consumption calculation unit. The evaluation value calculation unit calculates an evaluation value based on an evaluation function for each combination of the target speeds. The evaluation function is a function of multiplying the power consumption calculated by the power consumption calculation unit by a predetermined weight. The target speed determination unit determines a combination of the target speeds for which the evaluation value is minimized to be a target speed in each section of the vehicle.

Further, a seventh aspect of the present invention is a vehicle control device that controls acceleration of the vehicle based on the target speed determined by the target speed determination device of any one of the first to fourth aspects.

Further, an eighth aspect of the present invention is a vehicle that performs acceleration or deceleration based on a difference between the current speed and the target speed determined by the target speed determination device of any one of the first to fourth aspects.

Advantageous Effects of Invention

According to the above-described aspect, the target speed determination device calculates the target speed of each section of the vehicle rather than a traveling pattern of the vehicle. Accordingly, it is possible to secure punctuality of traveling of the vehicle regardless of a change in weather or the number of passengers. Further, according to the above-described aspect, the target speed determination device determines the target speed of each section to be a target speed at which the evaluation value obtained by multiplying the power consumption by a predetermined weight is minimized. Accordingly, it is possible to reduce power consumption.

DESCRIPTION OF EMBODIMENTS

«First Embodiment»

Hereinafter, a first embodiment will be described in detail with reference to the accompanying drawings.

A target speed determination device according to the first embodiment is a device that determines target speed of a vehicle. A vehicle that travels based on the target speed determined by the target speed determination device sets the target speed for each section when a track is divided into a plurality of sections (for example, a block section). The vehicle performs acceleration or deceleration (switching of a notch) based on a difference between the current speed and the target speed. Specifically, an Automatic Train Operation (ATO) device for a vehicle switches power running to ON when the current speed is a predetermined value or more less than the target speed. The ATO device switches power running and a brake to OFF (coasting) when the difference between the current speed and the target speed is equal to or smaller than a predetermined value. The ATO device switches the brake to ON when the current speed is a predetermined value or more higher than the target speed.

Figure 1:
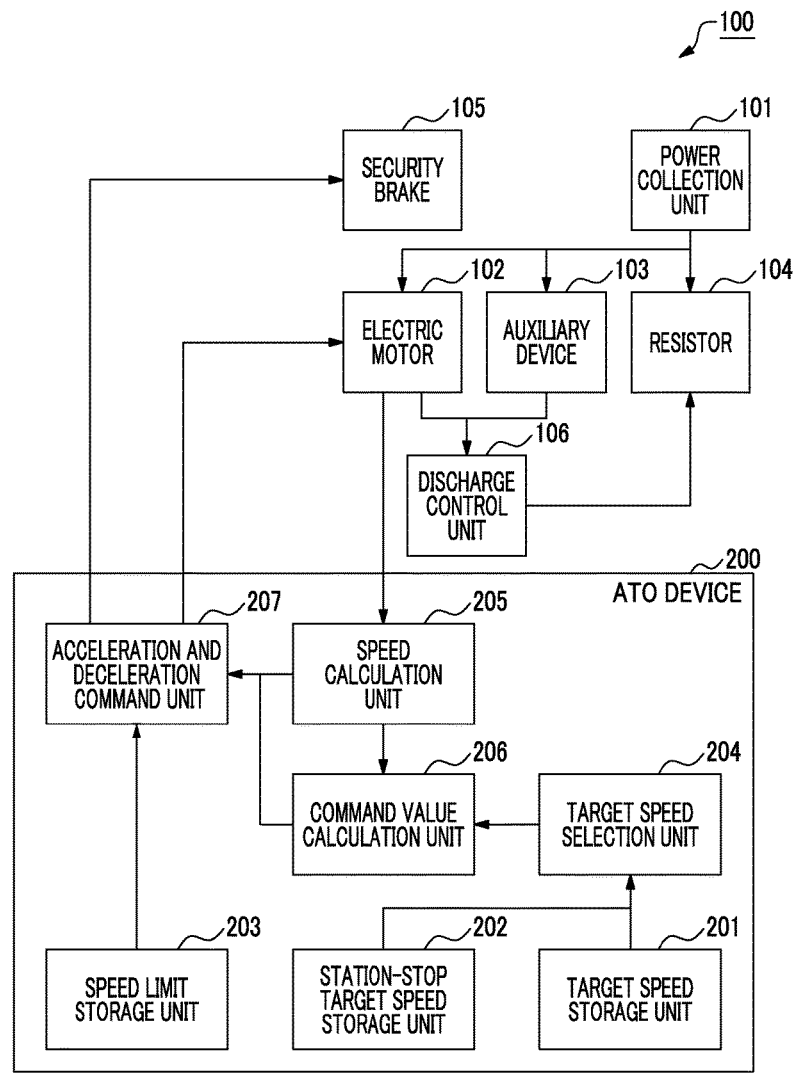
FIG. 1 is a schematic block diagram illustrating a configuration of a vehicle 100 according to a first embodiment of the present invention.

FIG. 1 is a schematic block diagram illustrating a configuration of a vehicle 100 according to a first embodiment of the present invention.

The vehicle 100 includes a power collection unit 101, an electric motor 102, an auxiliary device 103, a resistor 104, a security brake 105, a discharge control unit 106, and an ATO device (vehicle control device) 200.

The power collection unit 101 obtains electricity from an overhead line provided in a track. The power collection unit 101 supplies the electricity to the electric motor 102 and the auxiliary device 103. The power collection unit 101 supplies regenerative power not consumed by the resistor 104 in regenerative power of the electric motor 102 to the overhead line.

The electric motor 102 accelerates the vehicle 100 using the electricity supplied from the power collection unit 101.

The electric motor 102 decelerates the vehicle 100 by operating as a power generator. The electric motor 102 supplies the generated regenerative power to a Static InVerter (SIV) and the discharge control unit 106. The electric motor 102 is connected to another device via a Variable Voltage Variable Frequency (VVVF) inverter.

The auxiliary device 103 is a device other than the electric motor 102 mounted on the vehicle 100. The auxiliary device 103 is operated by the power supplied from the power collection unit 101. An example of the auxiliary device 103 includes an air conditioner. Further, the auxiliary device 103 is connected to another device via the SIV.

The resistor 104 consumes the regenerative power of the electric motor 102. The resistor reduces a corresponding voltage to be equal to or lower than an allowable voltage of the overhead line through consumption of the regenerative power.

The security brake 105 is a mechanical brake. The security brake 105 is provided separately from a regenerative brake by the electric motor 102. The security brake 105 is driven when speed of the vehicle 100 has exceeded a speed limit. The security brake 105 is driven to decelerate the vehicle 100.

When power generated by the regenerative brake of the electric motor 102 is higher than the power consumed by the auxiliary device 103, the discharge control unit 106 supplies the regenerative power of the electric motor 102 to the resistor 104.

The ATO device 200 calculates the speed of the vehicle 100 from the number of rotations of the electric motor 102. The ATO device 200 controls a notch of the electric motor 102 based on the calculated speed. That is, the ATO device 200 controls acceleration and deceleration of the vehicle 100 based on the speed of the vehicle 100 calculated from the number of rotations of the electric motor 102.

The ATO device 200 includes a target speed storage unit 201, a station-stop target speed storage unit 202, a speed limit storage unit 203, a target speed selection unit 204, a speed calculation unit 205, a command value calculation unit 206, and an acceleration and deceleration command unit 207.

The target speed storage unit 201 stores the target speed in each section determined by the target speed determination device.

The station-stop target speed storage unit 202 stores the target speed for causing the vehicle 100 to stop in a predetermined position of the station. Specifically, the target speed outside a certain section in front of the station is an allowable maximum speed. The target speed inside the certain section in front of the station is set to monotonically decrease with respect to a distance. That is, the target speed decreases as the vehicle is closer to the station. By setting the target speed appropriately, the ATO device 200 can reliably stop the vehicle 100 in a predetermined position of the station. Further, logic until the vehicle stops at the station is not limited thereto, and different logic may be used according to the ATO device 200.

The speed limit storage unit 203 stores the speed limit in each section. For example, the speed limit is set to be low for a section in which there is a gradient or a curve in the track.

The target speed selection unit 204 selects the target speed having a smaller value among the target speed stored in the target speed storage unit 201 and the target speed stored in the station-stop target speed storage unit 202 as the target speed for use in control of the vehicle 100.

The speed calculation unit 205 calculates the speed of the vehicle 100 based on the number of rotations of the electric motor 102.

The command value calculation unit 206 applies proportional control to a difference between the target speed selected by the target speed selection unit 204 and the speed calculated by the speed calculation unit 205. Accordingly, the command value calculation unit 206 calculates a notch command value indicating ON/OFF of the brake and ON/OFF of power running for controlling the electric motor 102.

The acceleration and deceleration command unit 207 controls the vehicle 100 based on the speed calculated by the speed calculation unit 205 and the speed limit stored in the speed limit storage unit 203. Specifically, when the speed calculated by the speed calculation unit 205 exceeds the speed limit, the acceleration and deceleration command unit 207 starts up the security brake 105. When the speed calculated by the speed calculation unit 205 is within the speed limit, the acceleration and deceleration command unit 207 outputs the notch command value calculated by the command value calculation unit 206 to the electric motor 102.

The target speed determination device 300 that determines the target speed used for traveling of the vehicle 100 described above will be described.

Figure 2:
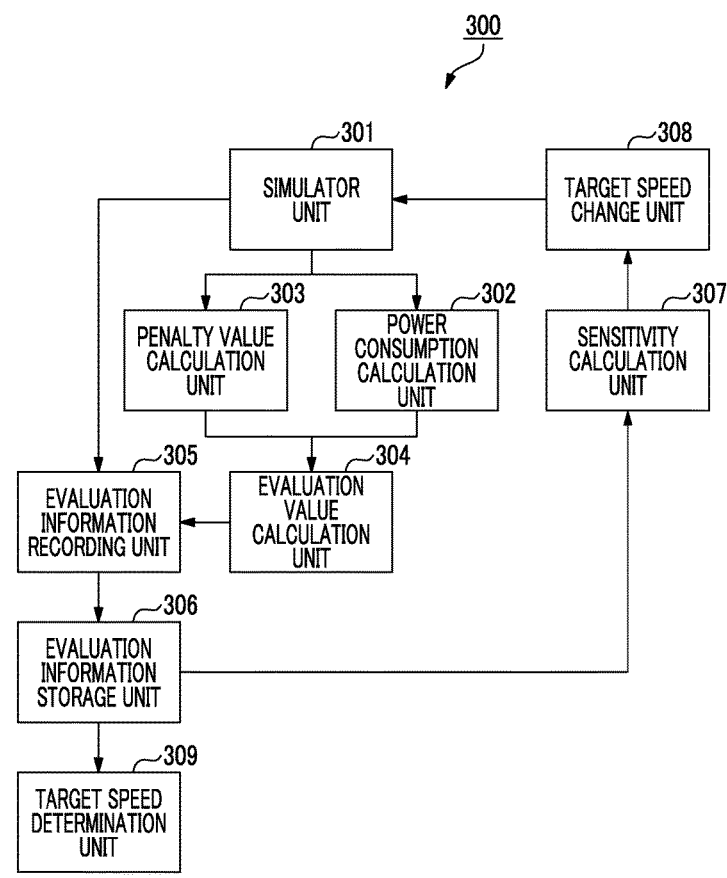
FIG. 2 is a schematic block diagram illustrating a configuration of a target speed determination device 300 according to the first embodiment of the present invention.

FIG. 2 is a schematic block diagram illustrating a configuration of the target speed determination device 300 according to the first embodiment.

The target speed determination device 300 includes a simulator unit 301, a power consumption calculation unit 302, a penalty value calculation unit 303, an evaluation value calculation unit 304, an evaluation information recording unit 305, an evaluation information storage unit 306, a sensitivity calculation unit 307, a target speed change unit 308, and a target speed determination unit 309.

The simulator unit 301 simulates traveling of the vehicle 100 based on track data, vehicle data, and the target speed of each section. The track data and the vehicle data are previously input data. The target speed of each section is data that is input from the target speed change unit 308. Information such as a position of a station, an inter-station traveling time, a speed limit of each section, and a curve and a gradient of the track is included in the track data. Information such as a composition number, a vehicle weight, and riding capacities is included in the vehicle data. Further, the simulator unit 301 outputs the power consumption of the vehicle 100, whether the vehicle 100 has arrived at the station, coordinates of the vehicle 100, a notch pattern, the speed of the vehicle 100 at each time as a result of the simulation.

The power consumption calculation unit 302 calculates total power consumption required for traveling on the track by the vehicle 100. The power consumption calculation unit 302 calculates the total power consumption based on the simulation result of the simulator unit 301.

The penalty value calculation unit 303 calculates the penalty value. The penalty value is a value indicating a degree of divergence between the simulation result of the simulator unit 301 and conditions to be satisfied by the vehicle 100 in traveling on the track. The conditions to be satisfied by the vehicle 100 in traveling on the track may include, for example, a jerk limit, a station arrival time, station arrival coordinates, or a speed limit. Further, the jerk limit indicates an upper limit of a jerk value (a temporal change rate of acceleration; jerk) of the vehicle 100. A comfortable ride is known to being bad when the jerk value of the vehicle 100 is higher. The penalty value calculation unit 303 in the present embodiment calculates the penalty value for each of a comfortable ride, the arrival time, the arrival coordinates, and the speed limit of the vehicle 100. Further, in this embodiment, the penalty value calculation unit 303 calculates a square of an excess width from a limit value as the penalty value. The embodiment of the present invention is not limited thereto and, for example, the penalty value calculation unit 303 may calculate the penalty value through fourth power of the excess width from the limit value. That is, the penalty value calculation unit 303 calculates the penalty value so that the penalty value increases when the excess width is greater.

The evaluation value calculation unit 304 calculates an evaluation value indicating a degree of appropriateness of the target speed based on an evaluation function. The evaluation function is a function for obtaining a total sum of values that are obtained by multiplying the power consumption calculated by the power consumption calculation unit 302 and the penalty value calculated by the penalty value calculation unit 303 by predetermined coefficients, respectively. In the evaluation function, the coefficient applied to the penalty value is sufficiently greater than the coefficient applied to the power consumption. For example, it is preferable for the coefficient related to the penalty value to be a value with which no overflow occurs. Accordingly, the evaluation value is great when the conditions to be satisfied by the vehicle 100 in traveling on the track are not satisfied. The smaller evaluation value indicates that the target speed is appropriate.

Figure 3:
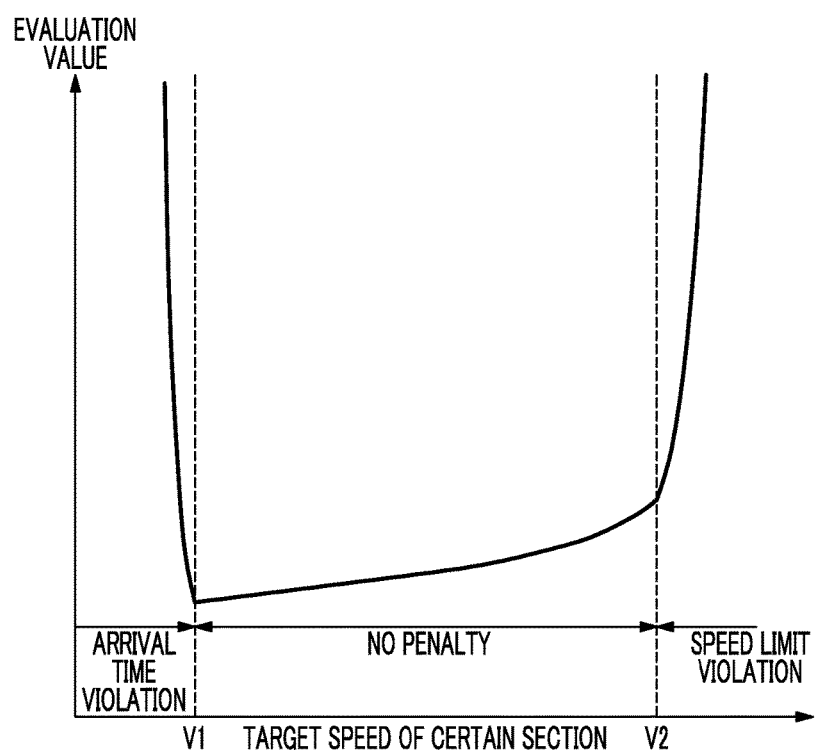
FIG. 3 is a diagram illustrating a change in an evaluation value when only target speed of one of a plurality of sections has been changed.

FIG. 3 is a diagram illustrating a change in the evaluation value when only the target speed of one of a plurality of sections has been changed.

FIG. 3 shows an example in which a simulation result indicating that the vehicle 100 does not arrive at the station on time has been obtained when simulation in which the target speed of a certain section is equal to or less than V1 has been performed. In this case, the penalty value calculation unit 303 calculates, as the penalty value, a value obtained by multiplying a square of a difference between a predetermined arrival time and the arrival time of the simulation result by a predetermined coefficient. Accordingly, the evaluation value increases when the target speed is smaller than V1.

Further, FIG. 3 shows an example in which a simulation result indicating that the speed of the vehicle 100 exceeds the speed limit has been obtained when simulation in which the target speed of a certain section is equal to or higher than V2 has been performed. In this case, the penalty value calculation unit 303 calculates, as the penalty value, a value obtained by multiplying a square of a difference between a predetermined speed limit and the speed of the simulation result by a predetermined coefficient. Accordingly, the evaluation value increases when the target speed is higher than V2.

Further, the coefficient by which the penalty value is multiplied is sufficiently greater than the coefficient applied to the power consumption, as described above. Accordingly, the target speed determination device 300 can specify the target speed at which the power consumption is reduced while satisfying conditions to be satisfied by the vehicle 100 in traveling on the track, by selecting the target speed for which the evaluation value is small.

The evaluation information recording unit 305 records the evaluation value and the target speed of each section in the evaluation information storage unit 306 in association with each other. The evaluation value is an evaluation value calculated by the evaluation value calculation unit 304. The target speed of each section is a target speed used for simulation by the simulator unit 301.

The evaluation information storage unit 306 stores the evaluation value calculated in the past and the target speed of each section when the evaluation value has been obtained in association with each other.

The sensitivity calculation unit 307 calculates sensitivity indicating a size of an amount of a change in the evaluation value with respect to the amount of change in the target speed for the plurality of sections of the track. The sensitivity calculation unit 307 calculates the sensitivity based on the evaluation value calculated by the evaluation value calculation unit 304 and the target speed of each section. The sensitivity calculation unit 307 partially differentiates an equation having the target speed of each section as an independent variable and the evaluation value as a dependent variable, and calculates the sensitivity by examining a gradient thereof.

The target speed change unit 308 increases or decreases the target speed of each section according to the sensitivity of each section calculated by the sensitivity calculation unit 307. The target speed of each section is the target speed for previous simulation by the simulator unit 301. Specifically, the target speed change unit 308 increases a degree of change in the target speed in the section in which the sensitivity is higher. The target speed change unit 308 decreases the degree of change in the target speed in the section in which the sensitivity is lower.

The target speed determination unit 309 determines whether a minimum value of the evaluation value stored in the evaluation information storage unit 306 has converged. When the target speed determination unit 309 determines that the minimum value of the evaluation value has converged, the target speed determination unit 309 determines the target speed of each section associated with the minimum evaluation value to be the target speed used for traveling of the vehicle 100.

Next, an operation of the target speed determination device 300 according to the first embodiment will be described.

Figure 4:
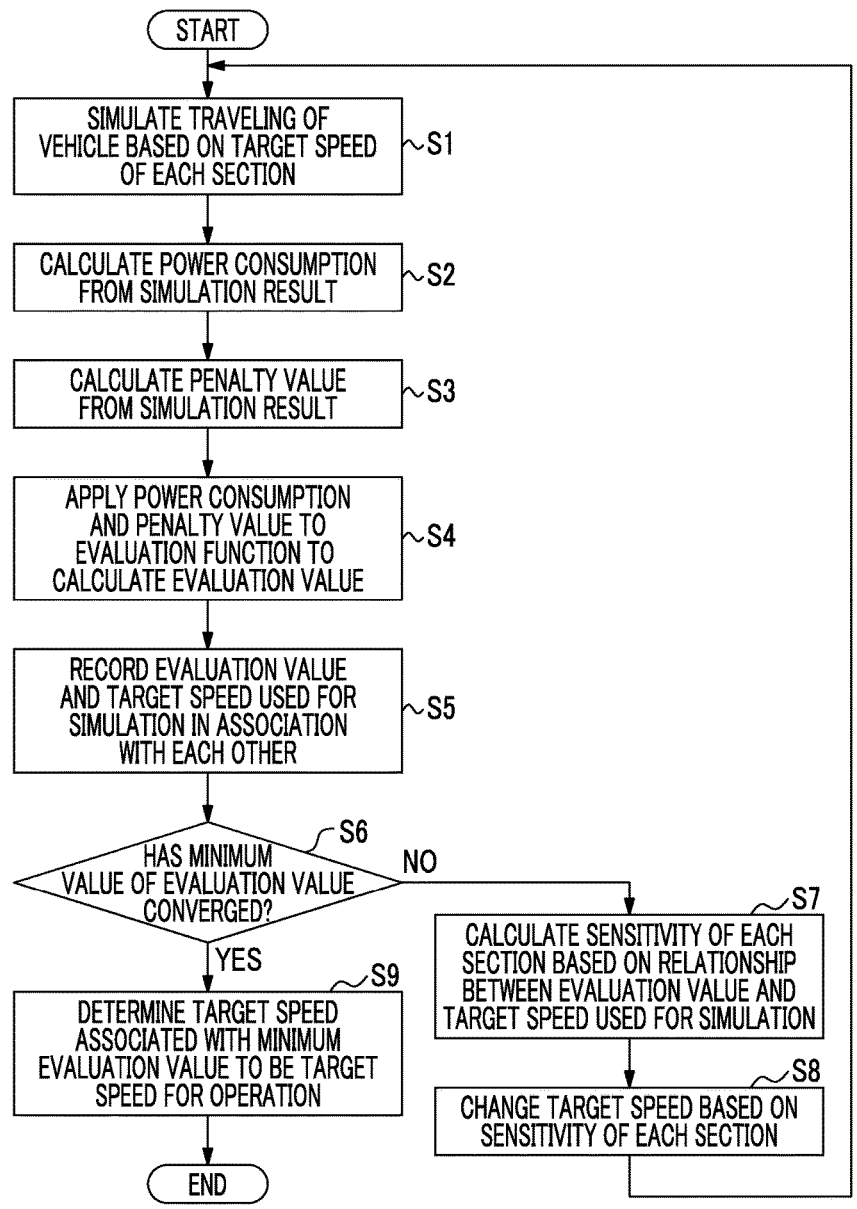
FIG. 4 is a flowchart illustrating an operation of the target speed determination device 300 according to the first embodiment of the present invention.

FIG. 4 is a flowchart illustrating an operation of the target speed determination device 300 according to the first embodiment.

First, the simulator unit 301 of the target speed determination device 300 simulates traveling of the vehicle 100 using an initial value of the target speed of each section (step S1). Then, the power consumption calculation unit 302 calculates power consumption when the vehicle 100 has traveled along the track based on the target speed (step S2). The power consumption calculation unit 302 calculates a total sum of power consumption values at respective times based on the simulation result of the simulator unit 301 to calculate the power consumption.

Further, the penalty value calculation unit 303 calculates the penalty value based on the simulation result of the simulator unit 301 (step S3). The penalty value calculation unit 303 calculates the penalty value for each of the comfortable ride, the arrival time, the arrival coordinates, and the speed limit of the vehicle 100. Specifically, when an amount of a notch time change in the simulation result is larger than an amount of notch time change for obtaining a predetermined minimum comfortable ride, the penalty value calculation unit 303 calculates a square of a difference between the amounts as the penalty value of the comfortable ride. Further, when the arrival time for the station in the simulation result is later than a predetermined arrival time, the penalty value calculation unit 303 calculates a square of a difference between the arrival times as the penalty value of the arrival time. Further, the penalty value calculation unit 303 calculates a square of a difference between the arrival coordinates for the station in the simulation result and predetermined arrival coordinates as the penalty value of the arrival coordinates. Further, when the speed of the vehicle 100 in the simulation result is higher than a predetermined speed limit, the penalty value calculation unit 303 calculates a square of a difference between the speed and the speed limit as the penalty value of the speed limit.

Then, the evaluation value calculation unit 304 applies the power consumption calculated by the power consumption calculation unit 302 and each penalty value calculated by the penalty value calculation unit 303 to a predetermined evaluation function to calculate an evaluation value (step S4). The evaluation function is a function of obtaining a total sum of values obtained by multiplying the power consumption and each penalty value by a predetermined coefficient. As described above, the coefficient of the penalty value is greater than the coefficient of power consumption, and is a value with which no overflow occurs.

Then, the evaluation information recording unit 305 records a combination of the evaluation value calculated by the evaluation value calculation unit 304 and the target speed used for the simulation by the simulator unit 301 on the evaluation information storage unit 306 in association with each other (step S5). Then, the target speed determination unit 309 determines whether a minimum value of the evaluation value has converged based on the evaluation value stored in the evaluation information storage unit 306 (step S6). In the present embodiment, an interior point method is used as a convergence calculation scheme. The present invention is not limited thereto, and in other embodiments, for example, when a deviation of a predetermined number of last calculated evaluation values is within a predetermined value, the target speed determination unit 309 may determine that the minimum value has converged.

When the target speed determination unit 309 determines that the minimum value of the evaluation value has not converged (step S6: NO), the sensitivity calculation unit 307 calculates sensitivity of the evaluation value in each section (step S7). The sensitivity calculation unit calculates sensitivity based on the evaluation value and the target speed of each section stored in the evaluation information storage unit 306. Specifically, the sensitivity calculation unit 307 performs partial differentiation on a predetermined function to calculate the sensitivity of each section. The function is a function having the target speed of each section as an independent variable and the evaluation value as a dependent variable. Further, in the present embodiment, an adjoint method is used as a sensitivity calculation scheme.

Then, the target speed change unit 308 changes the target speed of each section used for previous simulation by the simulator unit 301 (step S8). The target speed change unit 308 changes the target speed based on the sensitivity calculated by the sensitivity calculation unit 307. Specifically, the target speed change unit 308 changes the value of the target speed of the section in which the sensitivity is high to be relatively greater. The target speed change unit 308 changes the value of the target speed of the section in which the sensitivity is low to be relatively smaller. In this embodiment, a quasi-Newton method is used as a method of changing the target speed.

Then, the process returns to step S1 to perform simulation of traveling of the vehicle 100 using the changed target speed.

On the other hand, when the target speed determination unit 309 determines that the minimum value of the evaluation value has converged in step S6 (step S6: YES), the target speed determination unit 309 determines the target speed to be used for traveling of the vehicle 100 (step S9). The target speed determination unit 309 determines the target speed associated with the minimum evaluation value stored in the evaluation information storage unit 306 to be the target speed used for traveling of the vehicle 100.

Accordingly, the target speed determination device 300 can obtain a combination of target speeds for maximizing energy saving while satisfying the conditions to be satisfied by the vehicle 100 in traveling on the track. Further, the target speed determination device 300 can secure punctuality of traveling regardless of a change in weather or the number of passengers. This is because the target speed determination device 300 calculates optimal target speed rather than an optimal notch pattern and causes the vehicle 100 to travel based on the target speed.

«Second Embodiment»

Next, a second embodiment of the present invention will be described in detail with reference to the accompanying drawings.

A target charge rate determination device that calculates a target charge rate of a secondary battery mounted on a vehicle will be described as the second embodiment of the present invention. The target charge rate determination device according to the second embodiment determines target speed of a vehicle 100 having a configuration different from the target speed determination device 300 according to the first embodiment.

Figure 5:
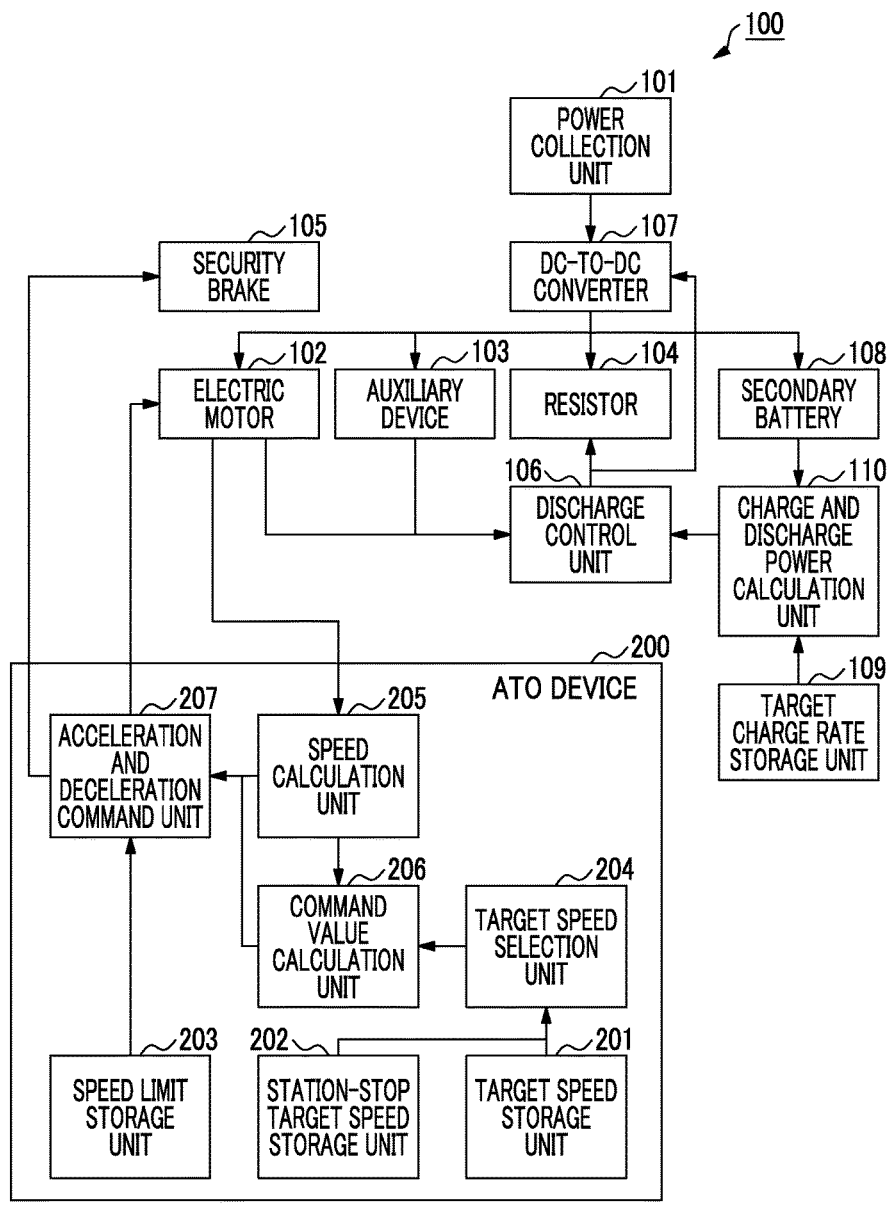
FIG. 5 is a schematic block diagram illustrating a configuration of a vehicle 100 according to a second embodiment of the present invention.

FIG. 5 is a schematic block diagram illustrating a configuration of a vehicle 100 according to the second embodiment of the present invention. Here, the same components as those of the vehicle 100 according to the first embodiment will be described using the same reference signs.

The vehicle 100 includes a DC-to-DC converter 107, a secondary battery 108, a target charge rate storage unit 109, and a charge and discharge power calculation unit 110, in addition to the configuration of the vehicle 100 according to the first embodiment.

The DC-to-DC converter 107 controls an amount of power supplied to an electric motor 102, an auxiliary device 103, and the secondary battery 108 by a power collection unit 101.

The secondary battery 108 is charged with the electricity supplied by the power collection unit 101 and electricity generated by the electric motor 102. The secondary battery 108 discharges the charged electricity and supplies the electricity to the electric motor 102 and the auxiliary device 103.

The target charge rate storage unit 109 stores a target charge rate of the secondary battery 108 in each section of the track calculated by a target charge rate determination device.

The charge and discharge power calculation unit 110 applies proportional control to a difference between the charge rate of the secondary battery 108 and the target charge rate stored in the target charge rate storage unit 109. Accordingly, the charge and discharge power calculation unit 110 calculates the power required for charge and discharge of the secondary battery 108.

A discharge control unit 106 of the vehicle 100 according to the second embodiment calculates power to be output to the DC-to-DC converter 107 and power to be charged and discharged in the secondary battery 108. The discharge control unit 106 calculates power to be output to the DC-to- DC converter 107 and power to charged and discharged in the secondary battery 108 based on charge and discharge power calculated by the charge and discharge power calculation unit 110, a power limit value of the DC-to-DC converter 107, and power required by the electric motor 102 and the auxiliary device 103.

Next, the target charge rate determination device 400 that determines the target charge rate of the secondary battery 108 used for traveling of the vehicle 100 described above will be described.

Figure 6:
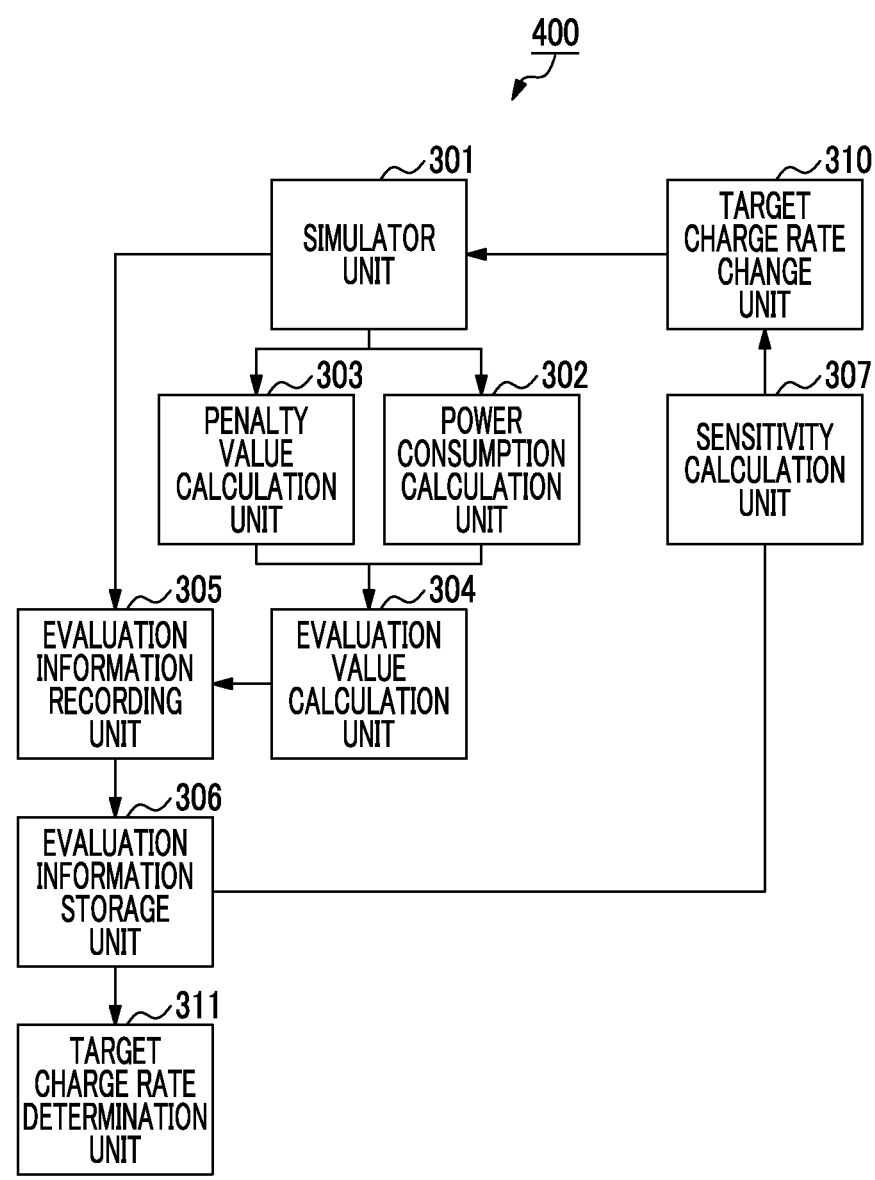
FIG. 6 is a schematic block diagram illustrating a configuration of a target charge rate determination device 400 according to the second embodiment of the present invention.

FIG. 6 is a schematic block diagram illustrating a configuration of the target charge rate determination device 400 according to the second embodiment of the present invention. Here, the same processing units as those of the target speed determination device 300 according to the first embodiment will be described using the same reference signs.

The target charge rate determination device 400 includes a simulator unit 301, a power consumption calculation unit 302, a penalty value calculation unit 303, an evaluation value calculation unit 304, an evaluation information recording unit 305, an evaluation information storage unit 306, a sensitivity calculation unit 307, a target charge rate change unit 310, and a target charge rate determination unit 311.

The simulator unit 301 simulates traveling of the vehicle 100 based on track data, vehicle data, target speed of each section, and a target charge rate of each section. The track data, the vehicle data, and the target speed of each section are previously input data. The target charge rate of each section is a data that is input from the target charge rate change unit 310. That is, in the simulator unit 301 according to the second embodiment, the traveling of the vehicle 100 is simulated using the same target speed.

The power consumption calculation unit 302 calculates total power consumption required for traveling on the track by the vehicle 100 based on the simulation result of the simulator unit 301.

The penalty value calculation unit 303 calculates the penalty value. The penalty value is a value indicating the degree of divergence between the simulation result of the simulator unit 301 and conditions to be satisfied by the vehicle 100 in traveling on the track. The penalty value calculation unit 303 according to the second embodiment also calculates penalty values for a temporal change in the charge rate, an operational range of the charge rate, and a charge rate at the time of station arrival, in addition to the penalty values calculated by the penalty value calculation unit 303 according to the first embodiment. The penalty value for the temporal change in the charge rate is provided in order to prevent the secondary battery 108 from deteriorating due to an excessive change in the charge rate of the secondary battery 108. The penalty value for the operational range of the charge rate is provided in order to prevent the secondary battery 108 from deteriorating due to the charge rate of the secondary battery 108 being out of the operational range. The penalty value for the charge rate at the time of station arrival is provided in order to hold the charge rate of the secondary battery 108 at which the vehicle 100 can continue to travel even after the vehicle 100 has arrived at the station.

The evaluation value calculation unit 304 calculates an evaluation value indicating a degree of appropriateness of the target charge rate based on an evaluation function. The evaluation function is a function for obtaining a total sum of values that are obtained by multiplying the power consumption calculated by the power consumption calculation unit 302 and the penalty value calculated by the penalty value calculation unit 303 by predetermined coefficients, respectively.

The evaluation information recording unit 305 records the evaluation value calculated by the evaluation value calculation unit 304 and the target charge rate of each section used for simulation by the simulator unit 301 in the evaluation information storage unit 306 in association with each other.

The evaluation information storage unit 306 stores the evaluation value that has been calculated in the past and the target charge rate of each section when the evaluation value has been obtained in association with each other.

The sensitivity calculation unit 307 calculates sensitivity indicating a size of an amount of a change in the evaluation value with respect to the amount of change in the target charge rate for the plurality of sections of the track based on the evaluation value calculated by the evaluation value calculation unit 304 and the target charge rate of each section.

The target charge rate change unit 310 increases or decreases the target charge rate of each section used for previous simulation by the simulator unit 301 according to the sensitivity of each section calculated by the sensitivity calculation unit 307. Specifically, the target charge rate change unit 310 increases a degree of change in the target charge rate in the section in which the sensitivity is higher, and decreases the degree of change in the target charge rate in the section in which the sensitivity is lower.

The target charge rate determination unit 311 determines whether a minimum value of the evaluation value stored in the evaluation information storage unit 306 has converged. When the target charge rate determination unit 311 determines that the minimum value of the evaluation value has converged, the target charge rate determination unit 311 determines the target charge rate of each section associated with the minimum evaluation value to be the target charge rate used for traveling of the vehicle 100.

Next, an operation of the target charge rate determination device 400 according to the second embodiment of the present invention will be described.

Figure 7:
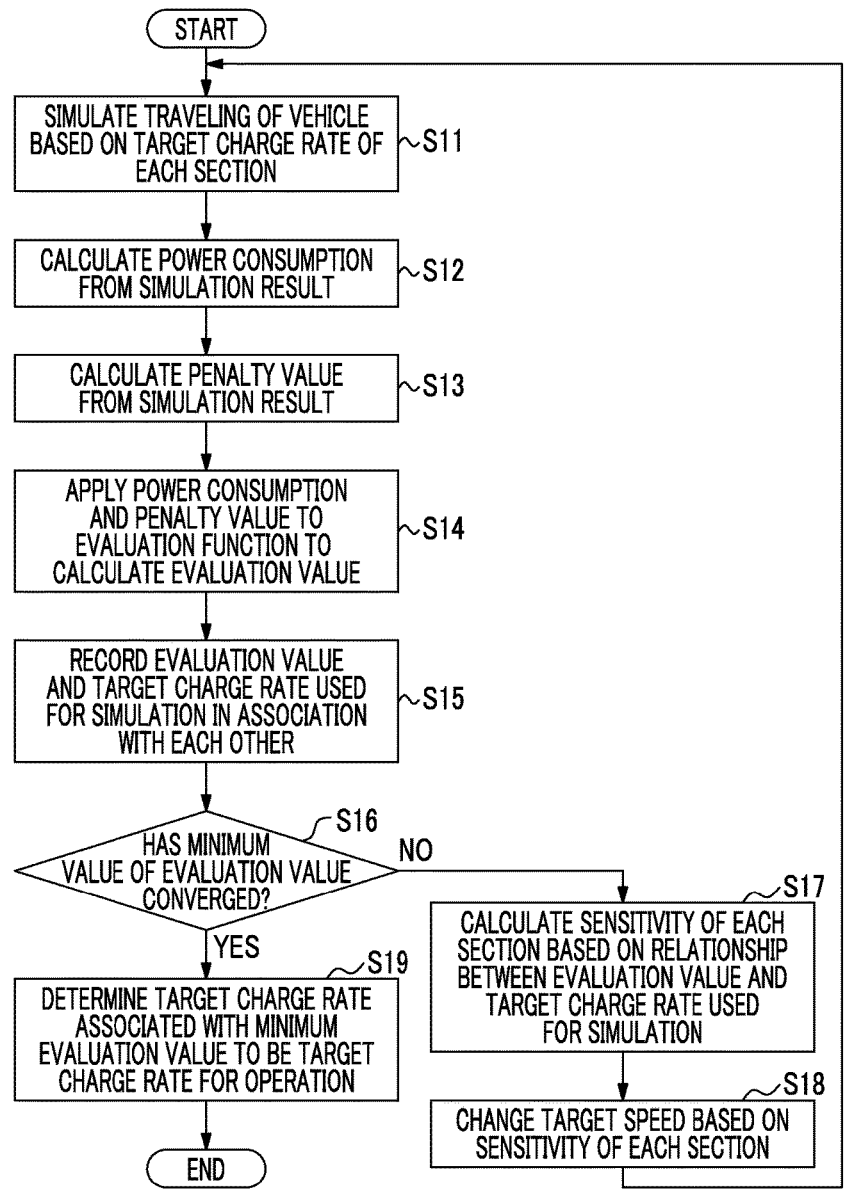
FIG. 7 is a flowchart illustrating an operation of the target charge rate determination device 400 according to the second embodiment of the present invention.

FIG. 7 is a flowchart illustrating an operation of the target charge rate determination device 400 according to the second embodiment of the present invention.

First, the simulator unit 301 of the target charge rate determination device 400 simulates traveling of the vehicle 100 using predetermined initial values of the target speed of each section and the target charge rate of each section (step S11). Then, the power consumption calculation unit 302 calculates a total sum of power consumption values at respective times from a simulation result of the simulator unit 301. Accordingly, the power consumption calculation unit 302 calculates the power consumption when the vehicle 100 has traveled on the track based on the target speed (step S12).

Further, the penalty value calculation unit 303 calculates the penalty value based on the simulation result of the simulator unit 301 (step S13). The penalty value calculation unit 303 calculates the penalty value for each of the comfortable ride, the arrival time, the arrival coordinates, the speed limit, the temporal change in the charge rate, the operational range of the charge rate, and the charge rate at the time of station arrival of the vehicle 100. Then, the evaluation value calculation unit 304 applies the power consumption calculated by the power consumption calculation unit 302 and each penalty value calculated by the penalty value calculation unit 303 to a predetermined evaluation function to calculate the evaluation value (step S14).

Then, the evaluation information recording unit 305 records a combination between the evaluation value calculated by the evaluation value calculation unit 304 and the target charge rate used for simulation by the simulator unit 301 in the evaluation information storage unit 306 in association with each other (step S15). Then, the target charge rate determination unit 311 determines whether the minimum value of the evaluation value has converged (step S16). The target charge rate determination unit 311 determines the convergence based on the evaluation value stored in the evaluation information storage unit 306.

When the target charge rate determination unit 311 determines that the minimum value of the evaluation value has not converged (step S16: NO), the sensitivity calculation unit 307 calculates sensitivity for the evaluation value in each section (step S17). The sensitivity calculation unit 307 calculates the sensitivity based on the evaluation value and the target charge rate of each section stored in the evaluation information storage unit 306. Specifically, the sensitivity calculation unit 307 performs partial differentiation on a predetermined function to calculate the sensitivity for each section. The function is a function having the target charge rate of each section as an independent variable and the evaluation value as a dependent variable.

Then, the target charge rate change unit 310 changes the target charge rate of each section used for previous simulation by the simulator unit 301 based on the sensitivity calculated by the sensitivity calculation unit 307 (step S18). Specifically, the target charge rate change unit 310 changes the value of the target charge rate in the section in which the sensitivity is high to be relatively greater, and changes the value of the target charge rate in the section in which the sensitivity is low to be relatively smaller.

Then, the process returns to step S11 to perform simulation of traveling of the vehicle 100 using the changed target charge rate.

On the other hand, when the target charge rate determination unit 311 determines that the minimum value of the evaluation value has converged in step S16 (step S16: YES), the target charge rate determination unit 311 determines the target charge rate associated with the minimum evaluation value stored in the evaluation information storage unit 306 to be a target charge rate used for traveling of the vehicle 100 (step S19).

Accordingly, the target charge rate determination device 400 can obtain a combination of the target charge rate for maximizing energy saving while satisfying the conditions to be satisfied by the vehicle 100 in the traveling of the track. In the second embodiment, it is possible to achieve a stable operation of the secondary battery 108 regardless of a change caused by deterioration of the secondary battery 108 since the target charge rate is optimized.

«Third Embodiment»

Next, a third embodiment of the present invention will be described in detail with reference to the accompanying drawings.

A target speed determination device 300 according to the third embodiment of the present invention is a combination of the target speed determination device 300 according to the first embodiment and the target charge rate determination device 400 according to the second embodiment. The target speed determination device 300 calculates the target speed and the target charge rate of each section for the vehicle 100 having the same configuration as the vehicle 100 according to the second embodiment.

Figure 8:
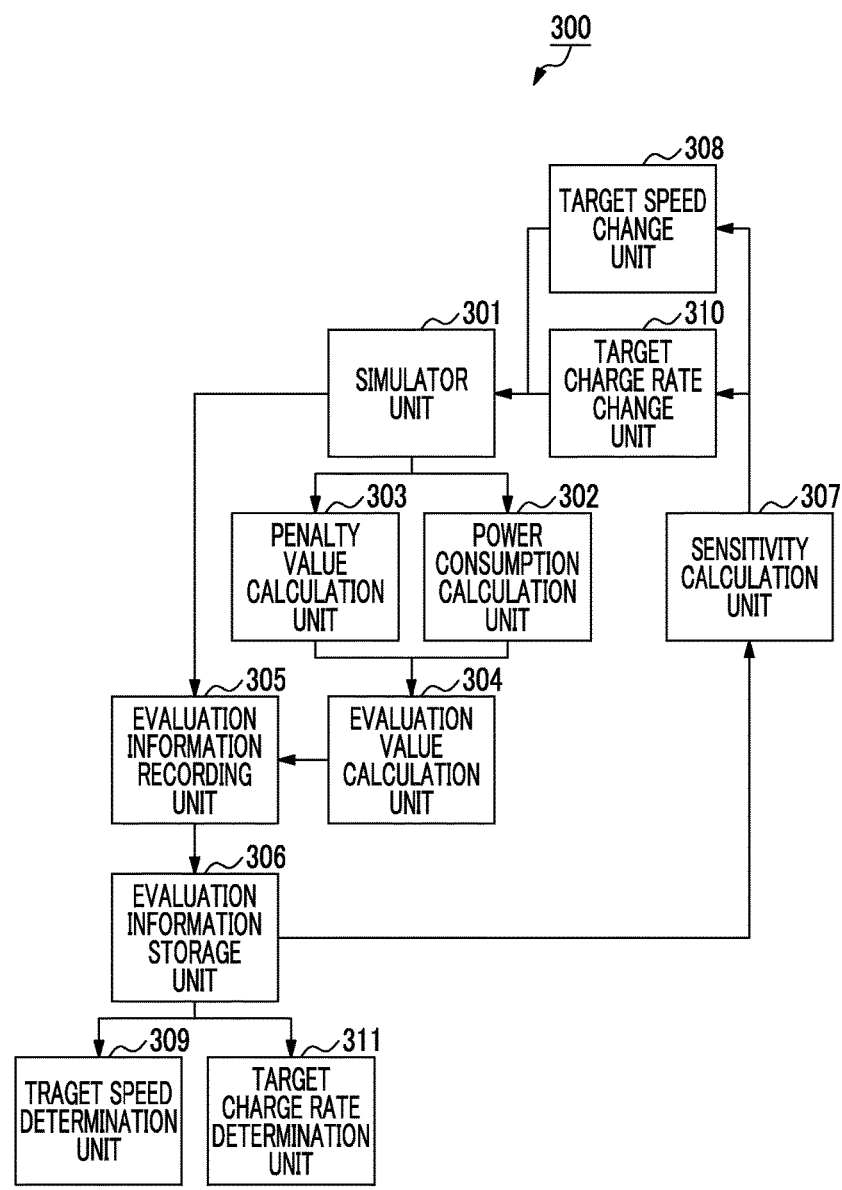
FIG. 8 is a schematic block diagram illustrating a configuration of a target speed determination device 300 according to a third embodiment of the present invention.

FIG. 8 is a schematic block diagram illustrating a configuration of the target speed determination device 300 according to the third embodiment of the present invention. The same processing units as those of the target speed determination device 300 according to the first embodiment or the target charge rate determination device 400 according to the second embodiment will be described using the same reference signs.

The target speed determination device 300 includes the target charge rate change unit 310 and the target charge rate determination unit 311 according to the second embodiment, in addition to the configuration of the first embodiment.

In the third embodiment, the simulator unit 301 simulates traveling of the vehicle 100 based on the target speed of each section input from the target speed change unit 308 and the target charge rate of each section input from the target charge rate change unit 310. The evaluation information recording unit 305 records the evaluation value, the target speed of each section, and the target charge rate of each section in the evaluation information storage unit 306 in association with one another. The evaluation value is the evaluation value calculated by the evaluation value calculation unit 304. The target speed of each section is the target speed used for simulation by the simulator unit 301. The evaluation information storage unit 306 stores the evaluation value calculated in the past, and the target speed and the target charge rate of each section when the evaluation value has been obtained in association with each other. The sensitivity calculation unit 307 calculates the sensitivity indicating a size of an amount of a change in the evaluation value with respect to an amount of a change in the target charge rate for the target speeds and the target charge rates of the plurality of sections of the track. The sensitivity calculation unit 307 calculates the sensitivity based on the evaluation value calculated by the evaluation value calculation unit 304, and the target speed and the target charge rate of each section.

Next, an operation of the target speed determination device 300 according to a third embodiment of the present invention will be described.

Figure 9:
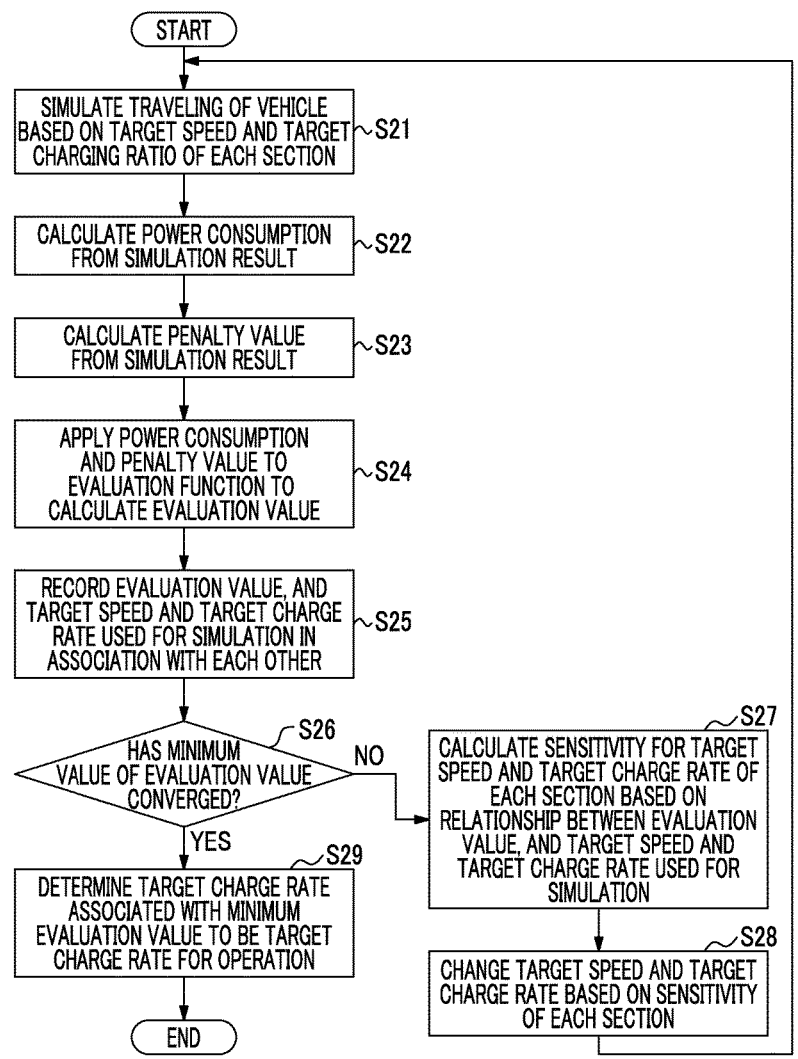
FIG. 9 is a flowchart illustrating an operation of the target speed determination device 300 according to the third embodiment of the present invention.

FIG. 9 is a flowchart illustrating the operation of the target speed determination device 300 according to the third embodiment of the present invention.

First, the simulator unit 301 of the target speed determination device 300 simulates traveling of the vehicle 100 using initial values of the target speed and the target charge rate of each section (step S21). Then, the power consumption calculation unit 302 calculates a total sum of power consumption values at respective times from a simulation result of the simulator unit 301. Accordingly, the power consumption calculation unit 302 calculates the power consumption when the vehicle has traveled on the track (step S22). That is, the power consumption calculation unit 302 calculates the power consumption when the vehicle 100 has traveled on the track based on the target speed and the target charge rate.

Further, the penalty value calculation unit 303 calculates the penalty value from the simulation result of the simulator unit 301 (step S23). The penalty value calculation unit 303 calculates the penalty value for each of a comfortable ride, an arrival time, arrival coordinates, a speed limit, a temporal change in the charge rate, an operational range of the charge rate, and a charge rate at the time of station arrival of the vehicle 100. Then, the evaluation value calculation unit 304 applies the power consumption calculated by the power consumption calculation unit 302 and each penalty value calculated by the penalty value calculation unit 303 to a predetermined evaluation function to calculate the evaluation value (step S24).

Then, the evaluation information recording unit 305 records a combination between the evaluation value calculated by the evaluation value calculation unit 304 and the target speed and the target charge rate used for simulation by the simulator unit 301 in the evaluation information storage unit 306 in association with each other (step S25). Then, the target speed determination unit 309 determines whether the minimum value of the evaluation value has converged based on the evaluation value stored in the evaluation information storage unit 306 (step S26).

When the target speed determination unit 309 determines that the minimum value of the evaluation value has not converged (step S26: NO), the sensitivity calculation unit 307 calculates sensitivity for the evaluation value with respect to the target speed and the target charge rate of each section (step S27). The sensitivity calculation unit 307 calculates the sensitivity based on the evaluation value, and the target speed and the target charge rate of each section stored in the evaluation information storage unit 306. Specifically, the sensitivity calculation unit 307 performs partial differentiation on a predetermined function to calculate the sensitivity for the target speed and the target charge rate of each section. The function is a function having the target speed and the target charge rate of each section as independent variables and the evaluation value as a dependent variable.

Then, the target speed change unit 308 changes the target speed of each section used for previous simulation by the simulator unit 301 based on the sensitivity calculated by the sensitivity calculation unit 307. The target charge rate change unit 310 changes the target charge rate of each section used for previous simulation by the simulator unit 301 based on the sensitivity calculated by the sensitivity calculation unit 307 (step S28).

Then, the target speed determination device 300 returns to step S21 to perform simulation of traveling of the vehicle 100 using the changed target speed and the changed target charge rate.

On the other hand, when the target speed determination unit 309 determines that the minimum value of the evaluation value has converged in step S26 (step S26: YES), the target speed determination unit 309 determines the target speed used for traveling of the vehicle 100. The target speed determination unit 309 determines the target speed associated with the minimum evaluation value stored in the evaluation information storage unit 306 to be a target speed used for traveling of the vehicle 100. Further, the target charge rate determination unit 311 determines the target charge rate associated with the minimum evaluation value stored in the evaluation information storage unit 306 to be a target charge rate used for traveling of the vehicle 100 (step S29).

Accordingly, the target speed determination device 300 can obtain a combination of the target speed and the target charge rate for maximizing energy saving while satisfying the conditions to be satisfied by the vehicle 100 in the traveling of the track.

Some of the embodiments have been described above in detail with reference to the accompanying drawings. However, a specific configuration is not limited to above-described configuration. Various design modifications or the like of the specific configuration can be made without departing from the gist.

For example, the case in which in the vehicle 100 according to the third embodiment, the electric motor 102, the auxiliary device 103, the resistor 104, and the secondary battery 108 are connected to the power collection unit 101 via the DC-to-DC converter 107 has been described, the present invention is not limited thereto.

Figure 10:
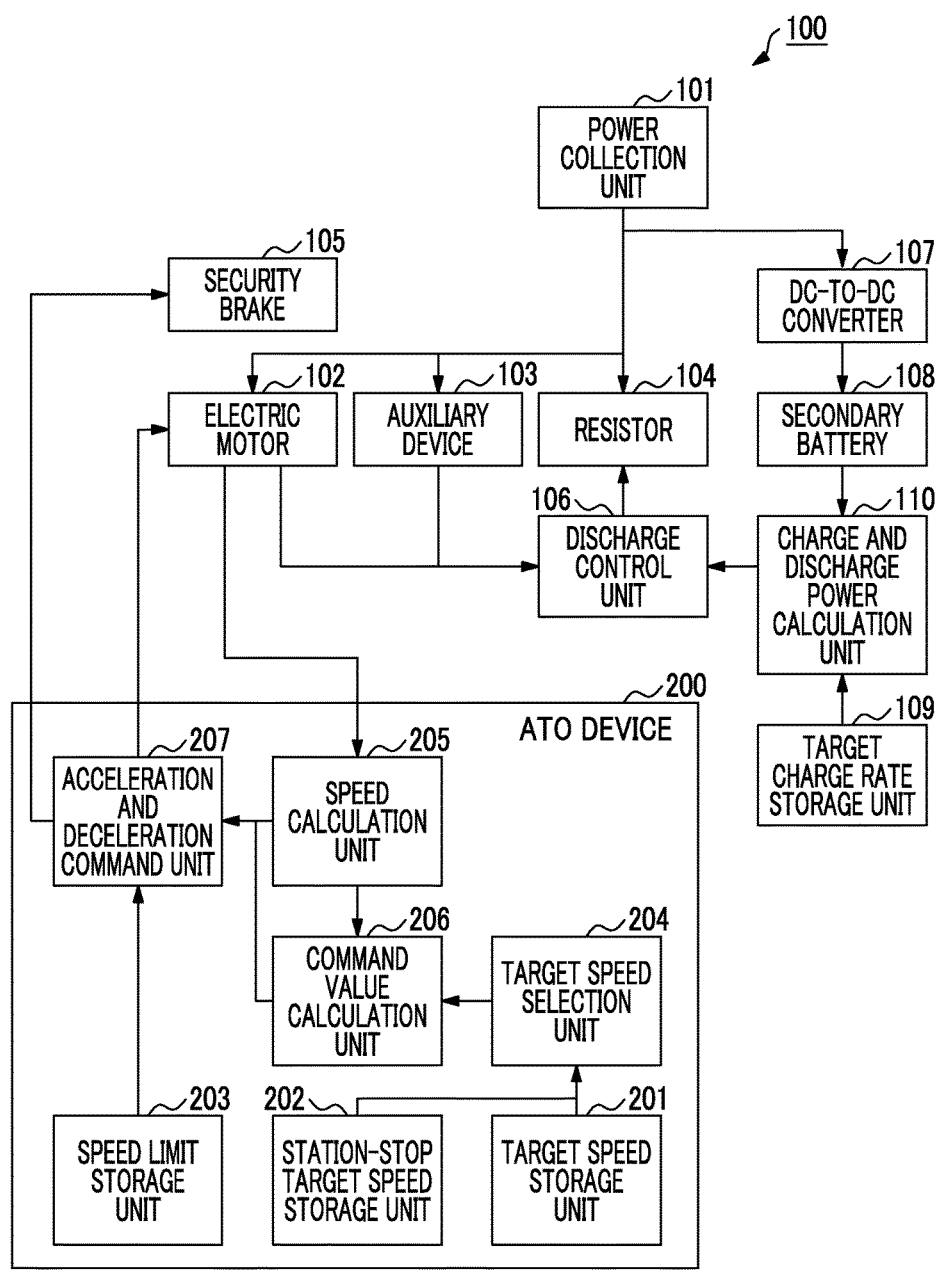
FIG. 10 is a schematic block diagram illustrating a configuration according to a modification example of the third embodiment of the present invention.

FIG. 10 is a schematic block diagram illustrating a configuration according to a modification example of the third embodiment of the present invention.

In the vehicle 100, the secondary battery 108 is connected to the power collection unit 101 via the DC-to-DC converter 107, and the electric motor 102, the auxiliary device 103, and the resistor 104 are directly connected to the power collection unit 101, as shown in FIG. 10.

The target speed determination device 300, the target charge rate determination device 400, and the ATO device 200 described above include a computer system provided therein. Also, the operation of each processing unit described above is recorded on a computer-readable non-transitory tangible recording medium in the form of a program. The computer reads and executes this program such that the process is performed. Here, the computer-readable non-transitory tangible recording medium refers to a magnetic disk, a magnetic optical disc, a CD-ROM, a DVD-ROM, a semiconductor memory, or the like. Further, this computer program may be distributed to the computer by a communication line, and the computer receiving the program may execute the program.

Further, the program may be intended to realize some of the above-described functions. Further, the program may be a program capable of realizing the above-described functions through a combination with a program previously recorded on a computer system, that is, a differential file (a differential program).

INDUSTRIAL APPLICABILITY

The target speed determination device calculates the target speed of each section of the vehicle rather than the traveling pattern of the vehicle. Accordingly, it is possible to secure punctuality of traveling of the vehicle regardless of a change in weather or the number of passengers. Further, the target speed determination device determines the target speed of each section to be a target speed at which the evaluation value obtained by multiplying the power consumption by a predetermined weight is minimized. Accordingly, the target speed determination device can reduce power consumption.

REFERENCE SIGNS LIST

100: VEHICLE 101: POWER COLLECTION UNIT 102: ELECTRIC MOTOR 103: AUXILIARY DEVICE 104: RESISTOR 105: SECURITY BRAKE 106: DISCHARGE CONTROL UNIT 107: DC-TO-DC CONVERTER 108: SECONDARY BATTERY 109: TARGET CHARGE RATE STORAGE UNIT 110: CHARGE AND DISCHARGE POWER CALCULATION UNIT 200: ATO DEVICE 201: TARGET SPEED STORAGE UNIT 202: STATION-STOP TARGET SPEED STORAGE UNIT 203: SPEED LIMIT STORAGE UNIT 204: TARGET SPEED SELECTION UNIT 205: SPEED CALCULATION UNIT 206: COMMAND VALUE CALCULATION UNIT 207: ACCELERATION AND DECELERATION COMMAND UNIT 300: TARGET SPEED DETERMINATION DEVICE 301: SIMULATOR UNIT 302: POWER CONSUMPTION CALCULATION UNIT 303: PENALTY VALUE CALCULATION UNIT 304: EVALUATION VALUE CALCULATION UNIT 305: EVALUATION INFORMATION RECORDING UNIT 306: EVALUATION INFORMATION STORAGE UNIT 307: SENSITIVITY CALCULATION

UNIT 308: TARGET SPEED CHANGE UNIT 309: TARGET SPEED DETERMINATION UNIT 310: TARGET CHARGE RATE CHANGE UNIT 311: TARGET CHARGE RATE DETERMINATION UNIT

The invention claim is:

1. A target speed determination device that is used for securing punctuality of traveling and reducing power consumption regardless of a change in acceleration characteristics of a vehicle and that determines target speed to be used for traveling of the vehicle that performs acceleration or deceleration according to a difference between current speed and the target speed to be used for traveling, the vehicle traveling on a track having a plurality of sections, the target speed determination device comprising:
   a simulator unit configured to simulate traveling of the vehicle on the track according to the target speed of each section;
   a power consumption calculation unit configured to calculate a power consumption of when the vehicle has traveled on the track, according to a simulation result of the simulator unit,
   a target speed change unit configured to change the target speed of each section;
   an evaluation value calculation unit configured to calculate an evaluation value according to the power consumption, the evaluation value being lower as the power consumption decreases;
   a sensitivity calculation unit configured to calculate speed sensitivity of each section, the speed sensitivity of each section indicating a magnitude of an amount of a change of the evaluation value with respect to an amount of a change of the target speed of each section; and
   a target speed determination unit configured to determine the target speed of each section for which the evaluation value is minimized to be the target speed used for traveling, and to record the target speed to be used for traveling to a target speed storage unit of the vehicle, wherein
   the target speed change unit is configured to increase or decrease the target speed of each section used for the previous simulation of the power consumption by the power consumption calculation unit according to the speed sensitivity of each section calculated by the sensitivity calculation unit, and
   the target speed determination device is further configured to control the traveling of the vehicle on the track according to the simulation result of the simulator unit.

2. The target speed determination device according to claim 1, further comprising:
   a penalty value calculation unit configured to calculate a penalty value indicating a degree of divergence from conditions to be satisfied by the vehicle in traveling on the track,
   wherein the evaluation value calculation unit configured to calculate an evaluation value according to an evaluation function,
   the evaluation function being a function of taking a total sum of a first value obtained by multiplying the power consumption by a first weight and a second value obtained by multiplying the penalty value by a second weight greater than the first weight.

3. The target speed determination device according to claim 1,
   wherein the vehicle includes a secondary battery and controls charge and discharge of the secondary battery according to a difference between a current charge rate and a target charge rate of the secondary battery to be used for traveling,
   the power consumption calculation unit is configured to calculate power consumption when the vehicle has traveled on the track, according to the target speed of each section and a target charge rate of each section,
   the sensitivity calculation unit is configured to calculate rate sensitivity of each section, the rate sensitivity of each section indicating a magnitude of an amount of a change of the evaluation value with respect to an amount of a change of the target charge rate of each section, and
   the target speed determination device further comprises:
   a target charge rate change unit configured to increase or decrease the target charge rate of each section used for the previous simulation of the charge rate by the power consumption calculation unit according to the rate sensitivity of each section calculated by the sensitivity calculation unit; and
   a target charge rate determination unit configured to determine the target charge rates for which the evaluation value is minimized to be the target charge rate to be used for traveling, and to record the target charge rate to be used for traveling to a target charge rate storage unit of the vehicle.

4. A vehicle control device that controls acceleration of the vehicle according to the target speed to be used for traveling stored in the target speed storage unit by the target speed determination device according to claim 1.

5. A vehicle that performs acceleration or deceleration according to difference between the current speed and the target speed to be used for traveling stored in the target speed storage unit by the target speed determination device according to claim 1.

6. A target speed determination method using a target speed determination device that is used for securing punctuality of traveling and reducing power consumption regardless of a change in acceleration characteristics of a vehicle and that determines target speed to be used for traveling of the vehicle that performs acceleration or deceleration according to a difference between current speed and the target speed to be used for traveling, the vehicle traveling on a track having a plurality of sections, the target speed determination method comprising steps of:
   causing a simulator unit to simulate traveling of the vehicle on the track according to target speed of each section;
   causing a power consumption calculation unit to calculate a power consumption of when the vehicle has traveled on the track, according to a simulation result of the simulator unit;
   causing a target speed change unit to change the target speed of each section;
   causing an evaluation value calculation unit to calculate an evaluation value according to the power consumption, the evaluation value being lower as the power consumption decreases;
   causing a sensitivity calculation unit to calculate speed sensitivity of each section, the speed sensitivity of each section indicating a magnitude of an amount of a change of the evaluation value with respect to an amount of a change of the target speed of each section;
   causing a target speed determination unit to determine the target speed of each section for which the evaluation value is minimized to be the target speed used for traveling and to record the target speed to be used for traveling to a target speed storage unit of the vehicle;

controlling the traveling of the vehicle on the track according to the simulation result of the simulator unit; and wherein the step of causing the target speed change unit to change the target speed of each section includes a step of increase or decrease the target speed of each section used for the previous simulation of the power consumption by the power consumption calculation unit according to the sensitivity of each section calculated by the sensitivity calculation unit.

7. A non-transitory computer readable recording medium storing a program for causing a computer of a target speed determination device that is used for securing punctuality of traveling and reducing power consumption regardless of a change in acceleration characteristics of a vehicle and that determines target speed to be used for traveling of the vehicle that performs acceleration or deceleration according to a difference between current speed and the target speed to be used for traveling, the vehicle traveling on a track having a plurality of sections, to function as:

a simulator unit configured to simulate traveling of the vehicle on the track according to the target speed of each section;

a power consumption calculation unit configured to calculate power consumption when the vehicle has traveled on the track, according to a simulation result of the simulator unit;

a target speed change unit configured to change the target speed of each section;

an evaluation value calculation unit configured to calculate an evaluation value according to the power consumption, the evaluation value being lower as the power consumption decreases;

a sensitivity calculation unit configured to calculate speed sensitivity of each section, the speed sensitivity of each section indicating a magnitude of an amount of a change of the evaluation value with respect to an amount of a change of the target speed of each section; and a target speed determination unit configured to determine the target speed of each section for which the evaluation value is minimized to be the target speed to be used for traveling, and to record the target speed to be used for traveling to a target speed storage unit of the vehicle, wherein the target speed change unit is configured to increase or decrease the target speed of each section used for the previous simulation of the power consumption by the power consumption calculation unit according to the speed sensitivity of each section calculated by the sensitivity calculation unit, and the target speed determination device is further configured to control the traveling of the vehicle on the track according to the simulation result of the simulator unit.

* * * * *